(12) United States Patent
Hanson et al.

(10) Patent No.: US 6,668,031 B1
(45) Date of Patent: *Dec. 23, 2003

(54) SYNCHRONIZED DATA CAPTURING CIRCUITS USING REDUCED VOLTAGE LEVELS AND METHODS THEREFOR

(75) Inventors: David Russell Hanson, Brewster, NY (US); Gerhard Mueller, Wappingers Falls, NY (US)

(73) Assignees: Infineon Technologies AG (DE); International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/377,588

(22) Filed: Aug. 19, 1999

Related U.S. Application Data

(60) Provisional application No. 60/119,905, filed on Feb. 12, 1999.

(51) Int. Cl.[7] ................................................. H04L 7/00
(52) U.S. Cl. ...................................... 375/355; 327/141
(58) Field of Search ........................... 375/354, 362–364, 375/316, 355, 365; 327/141, 100, 165–167, 178

(56) References Cited

U.S. PATENT DOCUMENTS 5,266,848 A * 11/1993 Nakagome et al. ............ 326/62

6,529,054 B1 * 3/2003 Hanson et al. ............... 375/354

* cited by examiner

Primary Examiner—Temesghen Ghebretinsae
Assistant Examiner—Kevin M Burd
(74) Attorney, Agent, or Firm—Lerner, David, Littenberg, Krumholz & Mentlik, LLP

(57) ABSTRACT

A synchronized data capture circuit configured to synchronize capturing of data in a data signal with a timing signal in an integrated circuit. The synchronized data circuit employs voltage signals having a reduced voltage level, the data signal and the timing signal having a first voltage level higher than the reduced voltage level. The synchronized data capture circuit includes a timing driver circuit arranged to receive the timing signal. The timing driver circuit outputs a reduced voltage timing signal having the reduced voltage level. There is included a data driver circuit arranged to receive the data signal and the timing signal, the data driver outputting a reduced voltage clocked data signal having the reduced voltage level. There is further included a data clocking circuit coupled to the timing driver circuit and the data driver circuit. The data clocking circuit is arranged to receive the reduced voltage timing signal and the reduced voltage clocked data signal. The data clocking circuit outputs a synchronized capture data signal having the first voltage level higher than the reduced voltage level.

30 Claims, 9 Drawing Sheets

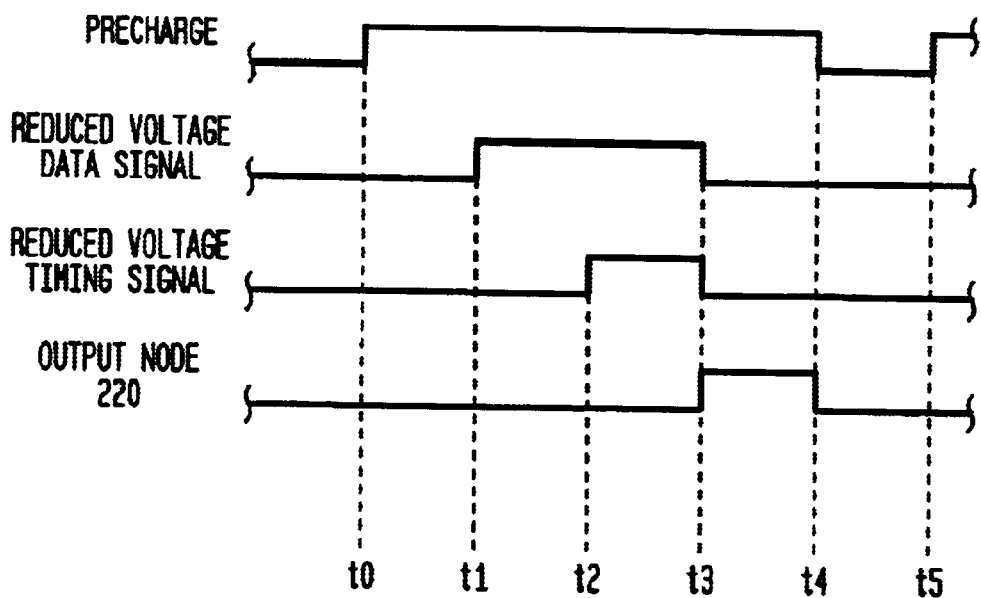
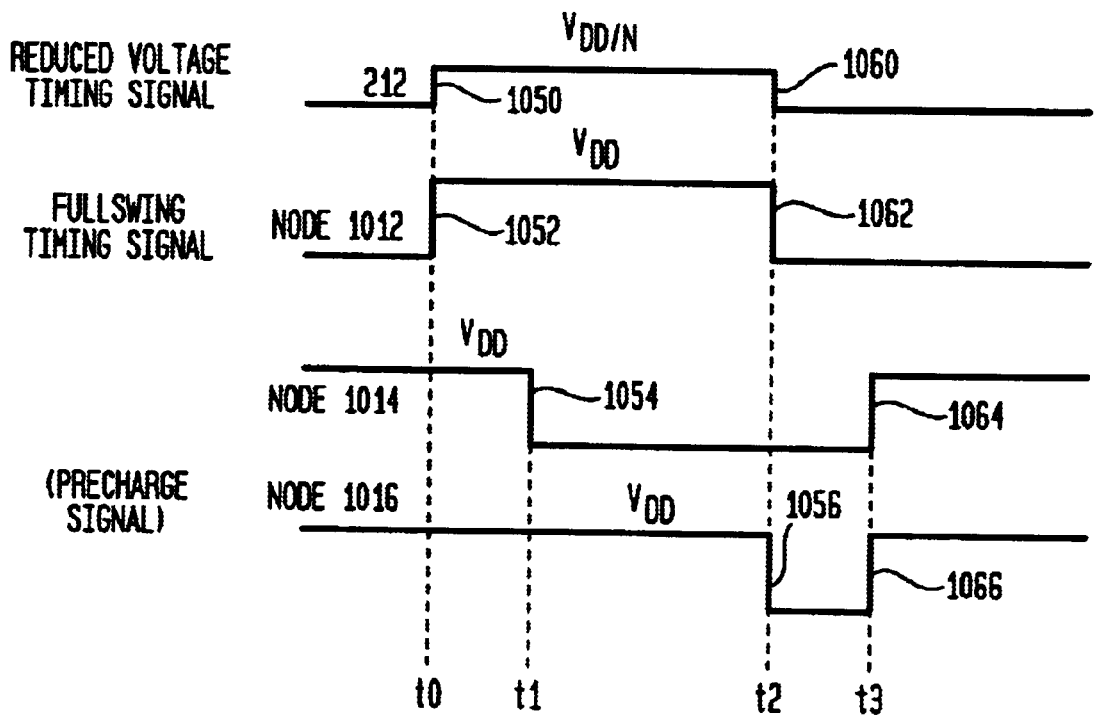

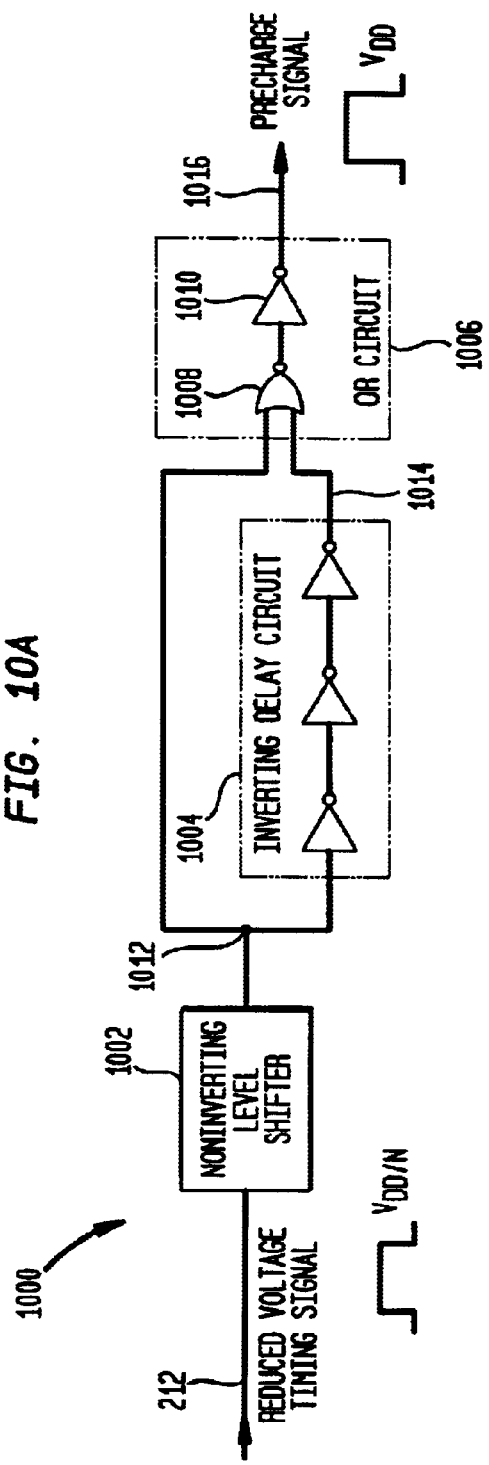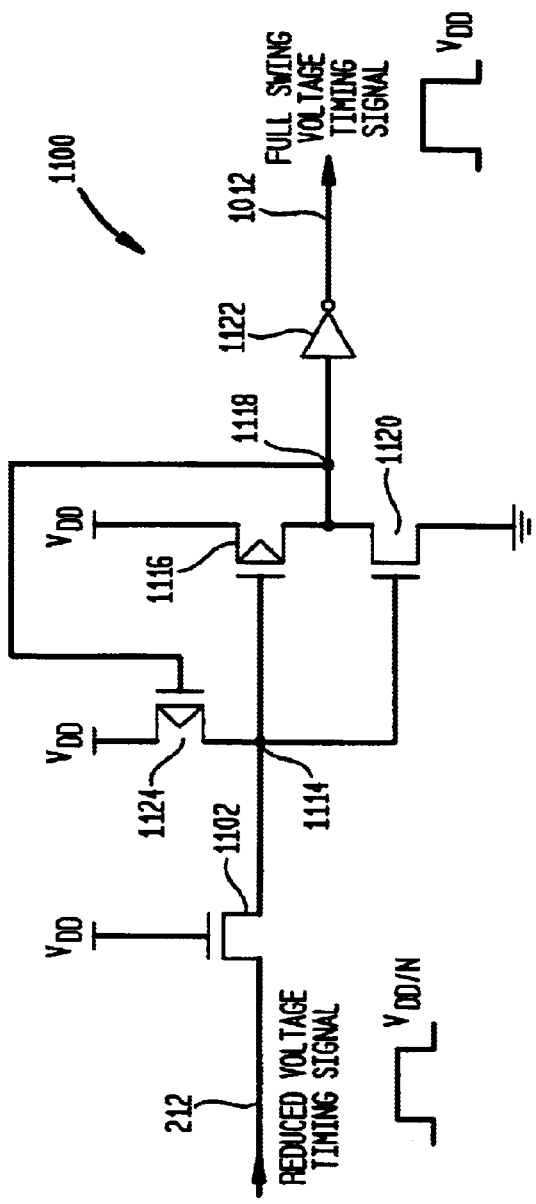

SYNCHRONIZED DATA CAPTURING CIRCUITS USING REDUCED VOLTAGE LEVELS AND METHODS THEREFOR

This application claims priority under 35 USC 119 (e) of a provisional application entitled "SYNCHRONIZED DATA CAPTURING CIRCUITS USING REDUCED VOLTAGE LEVELS AND METHODS THEREFOR" application Ser. No. 60/119,905, filed Feb. 12, 1999 by inventors David R. Hanson and Gerhard Mueller.

BACKGROUND OF THE INVENTION

The present invention relates to circuits for synchronizing data capture in an integrated circuit. More particularly, the present invention relates to circuits for synchronizing data capture that are capable of utilizing reduced voltage signals to reduce power consumption and/or to improve performance.

In any integrated circuit (IC), data signals often need to be transmitted from one circuit at one location on the IC to a receiving circuit at another location on the IC. As is well known by those skilled in the art, the data contained in the data signal is present in well defined data cycles, each of which has a finite period during which the data is valid for capture. Given that a data cycle is valid only for a limited period of time, it is crucial to ensure that the receiving circuit captures data during this relatively short period of time. This is particularly true in modern high speed IC's, which vastly reduce the duration of the data valid period, i.e., the time period during which data capturing must be performed.

To address the problem of properly capturing data at the receiving circuit during the limited time during which the data cycle is valid, timing or clock signals may be furnished to the receiving circuit. The use of a synchronized data capture circuit to synchronize data capture at the receiving circuit is well known. In general, if the timing signal tracks the data signal properly, the receiving circuit can depend on the timing information furnished in the timing signal to decide when to capture the data contained in the data signal.

To facilitate discussion, FIG. 1A illustrates a prior art circuit 100 for synchronizing data capture at a receiving circuit on the IC. Circuit 100 is shown in include a timing delay/driver 102, a data delay/driver 104, and a clocked data driver 106. A data signal 108 is shown input into data delay/driver 104, which is clocked by a control signal 110, to produce a clocked data signal 112. The same control signal 110 also clocks timing delay/driver 102, producing a timing signal 114. Timing delay/driver 102 and data delay/driver 104 ensure that timing signal 114 properly tracks clocked data signal 112 for the specific IC on which circuit 100 is implemented to allow clocked data driver 106 to properly capture the data contained in clocked data signal 112 based on the timing information furnished by timing signal 114. The captured data is shown output from clocked data driver 106 as output data 116 in FIG. 1A. The data synchronizing circuit of FIG. 1A is well known and will not be belabored further for the sake of brevity.

Although circuit 100 of FIG. 1A accomplishes the function of synchronizing data capture, there are significant disadvantages. One major disadvantage of the configuration shown in FIG. 1A relates to the fact prior art circuit 100 needs to operate with full swing signals (i.e., signals having the full rail-to-rail voltage swing of the IC) to perform synchronized data capture. More specifically, prior art circuit 100 is incapable of utilizing reduced voltage signals to perform the synchronized data capture task. As the term is employed herein, reduced voltage signals refer to signals whose amplitude is within a reduced voltage range, i.e., a voltage range that is lower than the full $V_{DD}$, the power supply at which the peripheral circuits operate. In some cases, the reduced voltage level maybe low enough (e.g., 1V) that it approaches the threshold voltage of the transistors (typically at around 0.7V or so). Since reduced voltage signals are useful in reducing circuit power consumption and/or improving performance, the inability of prior art circuit 100 to employ reduced voltage signals to perform its synchronized data capture task represents a serious shortcoming.

One reason underlying the inability of prior art circuit 100 to employ reduced voltage signals to perform synchronized data capture relates to one of its basic building blocks, the CMOS inverter. CMOS inverters are a basic building block of delay circuits, such as those present in timing/delay driver 102 and data delay/driver 104. To facilitate discussion, FIG. 1B depicts a simple CMOS inverter 150, which includes a p-FET transistor 152 coupled in series with an n-FET transistor 154 between $V_{DD}$ and ground.

Consider first the situation wherein a full swing signal is employed at the input of CMOS inverter 150. When input signal A at the input of CMOS inverter 150 is high at the $V_{DD}$ level, p-FET 152 is off and n-FET 154 is on, causing output signal B to be pulled to ground. Conversely, when input signal A at the input of CMOS inverter 150 is low at the ground level, p-FET 152 is on and n-FET 154 is off, causing output signal B to be pulled to $V_{DD}$. In this case, CMOS inverter 150 functions correctly.

Now consider the situation wherein a reduced voltage signal is employed as an input signal A to CMOS inverter 150. If the reduced voltage signal is, for example, 1 volt, a high input signal A not only causes n-FET 154 to be on as expected but also causes p-FET 152 to be softly on (i.e., not fully turning p-FET 152 off). In this case, the leakage current through p-PET 152 degrades the signal at the output of CMOS inverter 150, which may cause other circuits to misinterpret the logic level represented by output signal B of CMOS inverter 150. Furthermore, the leakage current through p-PET 152 to ground also causes CMOS inverter 150 to consume an unacceptable amount of power. Because of these issues and others, reduced voltage signals have not, to date, been employed in synchronized data capturing circuits to perform the synchronized data capture task.

As can be appreciated from the foregoing, there are desired synchronized data capturing circuits and methods therefore that can utilize reduced voltage signals to reduce power consumption and/or to increase performance.

SUMMARY OF THE INVENTION

The invention relates, in one embodiment, to a synchronized data capture circuit configured to synchronize capturing of data in a data signal with a timing signal in an integrated circuit. The synchronized data circuit employs voltage signals having a reduced voltage level, the data signal and the timing signal having a first voltage level higher than the reduced voltage level. The synchronized data capture circuit includes a timing driver circuit arranged to receive the timing signal. The timing driver circuit outputs a reduced voltage timing signal having the reduced voltage level. There is included a data driver circuit arranged to receive the data signal and the timing signal, the data driver outputting a reduced voltage clocked data signal having the reduced voltage level. There is further included a data clocking circuit coupled to the timing driver circuit and the data driver circuit. The data clocking circuit is arranged to receive the reduced voltage timing signal and the reduced voltage clocked data signal. The data clocking circuit outputs a synchronized capture data signal having the first voltage level higher than the reduced voltage level.

In another embodiment, the invention relates to a method for synchronizing capturing of data in a data signal with a timing signal in an integrated circuit. The method employs voltage signals having a reduced voltage level to accomplish the synchronized data capturing. The data signal and the timing signal have a first voltage level higher than the reduced voltage level. The method includes receiving the timing signal using a timing driver circuit and outputting, responsive to the timing signal, a reduced voltage timing signal having the reduced voltage level from the timing driver circuit. The method further includes receiving the data signal and the timing signal using a data driver circuit and outputting, responsive to the data signal and the timing signal, a reduced voltage clocked data signal having the reduced voltage level from the data driver circuit. There is further included performing the synchronizing data capturing using information contained in reduced voltage timing signal and the reduced voltage clocked data signal. Additionally, there is included outputting a synchronized capture data signal having the first voltage level higher than the reduced voltage level responsive to the performing the synchronizing data capturing.

These and other features of the present invention will be described in more detail below in the detailed description of the invention and in conjunction with the following figures.

BRIEF DESCRIPTION OF THE DRAWINGS

The present invention will be readily understood by the following detailed scription in conjunction with the accompanying drawings, wherein like reference numerals designate like structural elements, and in which.

FIGS. 8 and 9 illustrate, in accordance with one embodiment of the present invention, a detailed implementation of data clocking circuit of FIG. 7 and the timing diagram therefore.

FIGS. 10A and 10B illustrate, in accordance with one embodiment of the present invention, a detailed implementation of precharge generation circuit of FIG. 8 and the timing diagram therefor.

FIG. 11 illustrates, in accordance with one embodiment of the present invention a non-inverting level shifter for use with the precharge generation circuit of FIG. 10A.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known structures and/or process steps have not been described in detail in order to not unnecessarily obscure the present invention.

In accordance with one aspect of the present invention, there is provided a synchronized data capture circuit that is configured for synchronizing data capture of data in a data signal transmitted to a receiving circuit of an IC. The inventive synchronized data capture circuit advantageously receives as its input the full swing timing/control signal and data signal, thus rendering it compatible for use with transmitting circuits of the IC. Furthermore, the inventive synchronized data capture circuit advantageously outputs the full swing synchronized capture data signal for use by the receiving circuits of the IC. However, the inventive synchronized data capture circuit advantageously employs reduced voltage signals to synchronize data with timing, thereby reducing power consumption and/or improving performance.

In one embodiment, the inventive synchronized data capture circuit includes a timing driver circuit, a data driver circuit, and a data clocking circuit. The timing driver circuit is configured to receive the full swing timing signal and outputs a reduced voltage timing signal for use internally within the synchronized data capture circuit. The data driver circuit is configured to receive the full swing data signal and the full swing control/timing signal and outputs a reduced voltage clocked data signal for use in synchronizing with the timing signal at the data clocking circuit. The data clocking circuit receives both the reduced voltage timing signal and the reduced voltage clocked data signal, synchronizes the data capture using these two reduced voltage signals, and outputs a full swing synchronized capture data signal.

Figure 1A:
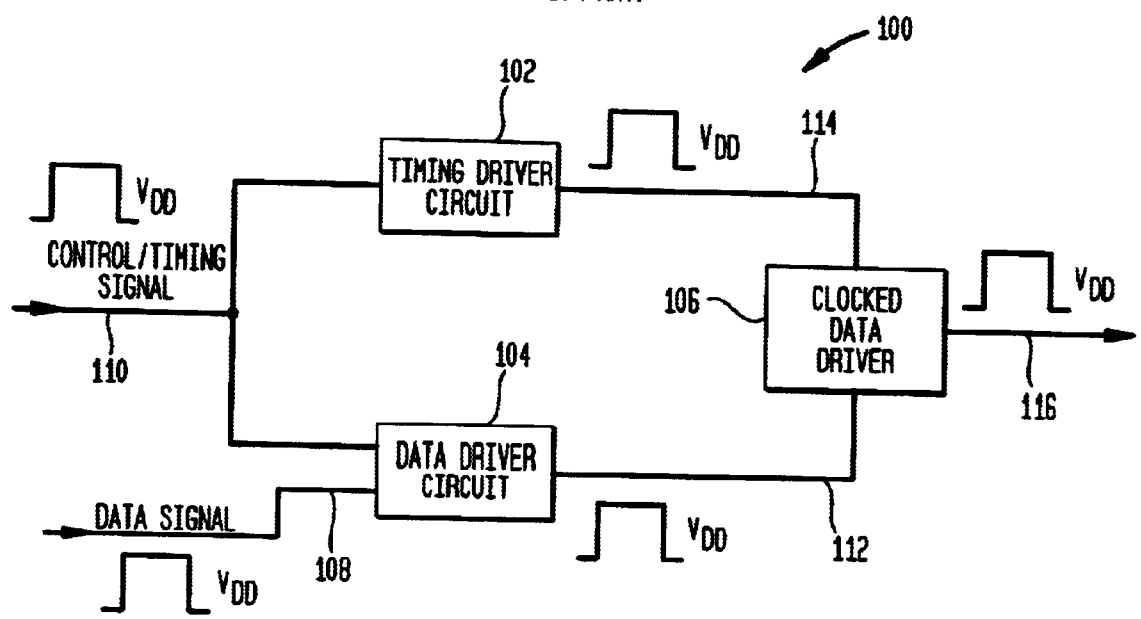
FIG. 1A illustrates, to facilitate discussion, a prior art circuit for synchronizing data capture at a receiving circuit on the IC.
Figure 1B:
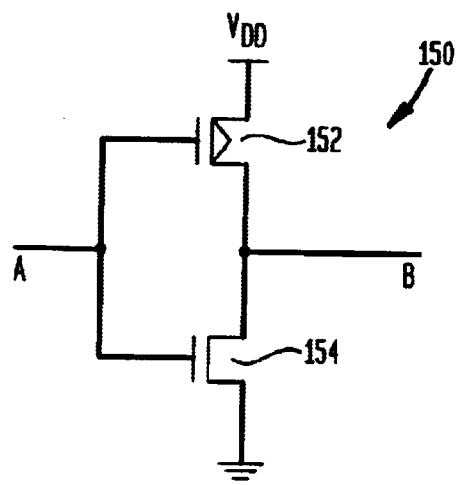
FIG. 1B depicts a standard CMOS inverter to facilitate discussion of the problems typically encountered when a reduced voltage data signal is employed in a standard CMOS inverter.
Figure 2:
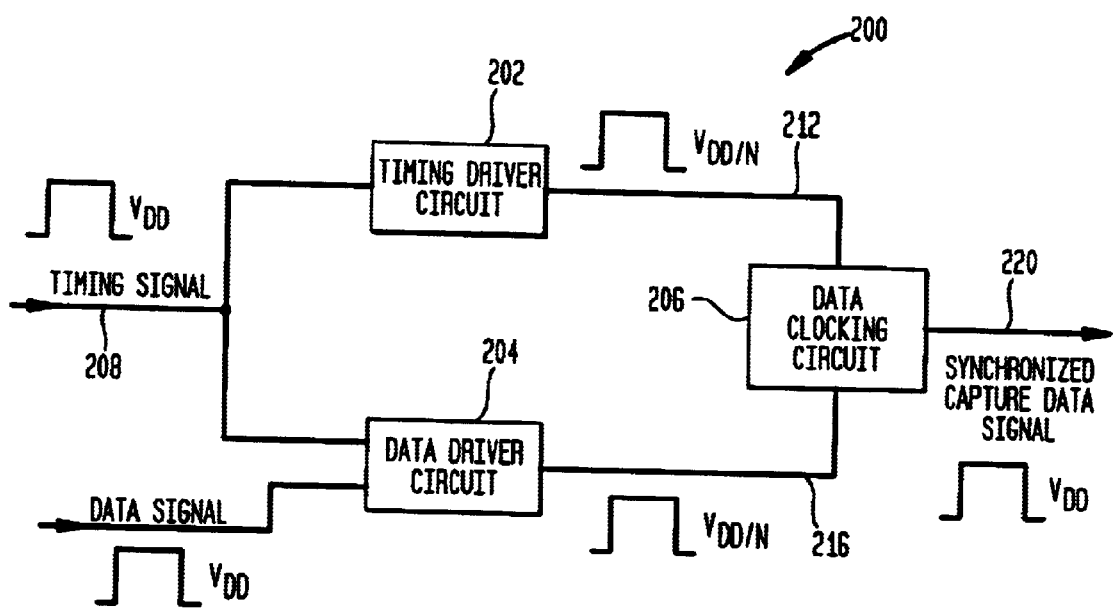
FIG. 2 illustrates, in accordance with one embodiment of the present invention, a high level block diagram of a synchronized data capture circuit that is capable of receiving and outputting full swing signals while generating and employing reduced voltage signals to synchronize data capture in order to reduce power consumption and/or improve performance.

The features and advantages of the present invention may be better understood with reference to the figures and discussions that follow. FIG. 2 illustrates, in accordance with one embodiment of the present invention, a high level block diagram of a synchronized data capture circuit 200 that is capable of receiving and outputting full swing signals while generating and employing reduced voltage signals to synchronize data capture in order to reduce power consumption and/or improve performance. Synchronized data capture circuit 200 includes a timing driver circuit 202, a data driver circuit 204, and a data clocking circuit 206.

Timing driver circuit 202 is configured to receive the full swing timing signal at an input node 208. Since timing driver circuit 202 is configured to handle the full swing voltage level at its input, the synchronized data capture circuit 200 is compatible with transmitting circuits in the IC that employ the full swing voltage level. In addition to adding the necessary delay to the full swing timing signal to facilitate proper data capture at the receiving circuit, timing driver circuit 202 also shifts the voltage level of the timing signal to output a reduced voltage timing signal. The reduced voltage timing signal has a reduced voltage level that is lower than the voltage level of the full swing signal to advantageously reduce power consumption and/or improve performance. The reduced voltage timing signal is input into data clocking circuit 206 by way of a conductor 212 as shown in FIG. 2. Since conductor 212 is typically heavily loaded and has a high capacitance, the ability to use a reduced voltage signal on this conductor in the data capture task vastly reduces power consumption and/or improves performance.

Data driver circuit 204 is configured to receive the full swing timing signal from input node 208 and the full swing data signal from an input node 214. In addition to clocking the data signal using the timing signal prior to transmitting it to data clocking circuit 206, data driver circuit 204 also shifts the voltage level of the clocked data signal to produce a reduced voltage clocked data signal. The reduced voltage clocked data signal has a reduced voltage level that is lower than the voltage level of the full swing signal to advantageously reduce power consumption and/or improve performance. The reduced voltage clocked data signal is input into data clocking circuit 206 by way of a conductor 216 as shown in FIG. 2. Like conductor 212, conductor 216 is typically heavily loaded and has a high capacitance. Consequently, the ability to use a reduced voltage signal on this conductor in the data capture task also vastly reduces power consumption and/or improves performance.

Data clocking circuit 206 synchronizes data capture on the reduced voltage clocked data signal using the timing information provided in the reduced voltage timing signal and outputs a full swing synchronized capture data signal at an output node 220. The full swing synchronized capture data signal contains the data that has been captured at the receiving circuit end in a synchronized manner with the timing information provided in the timing signal. Since the synchronized capture data signal on output node 220 has a full swing voltage level, this signal can be readily utilized by receiving circuits of the IC that operate using the full swing voltage level, thus rendering synchronized data capture circuit 200 compatible both at its input and output with circuitry within the IC that operates at the full swing voltage level.

Figure 3:
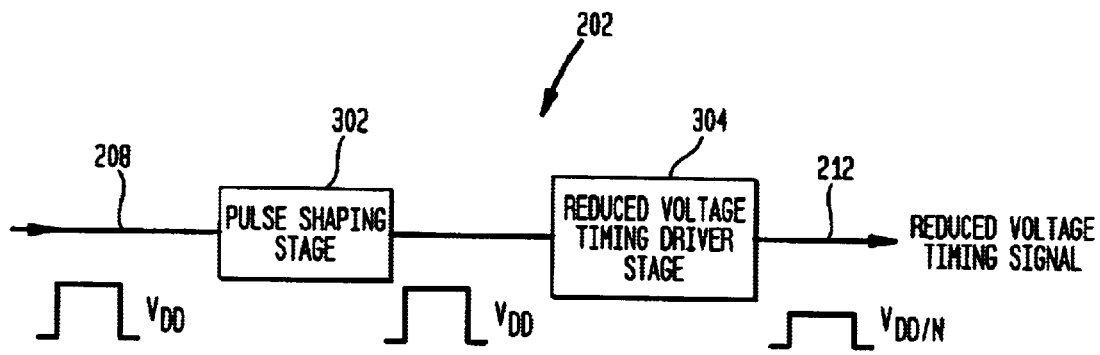
FIG. 3 illustrates, in accordance with one embodiment of the present invention, a high level block diagram implementation of timing driver circuit of FIG. 2.

FIG. 3 illustrates, in accordance with one embodiment of the present invention, a high level block diagram implementation of timing driver circuit 202 of FIG. 2. Timing driver circuit 202, as mentioned, receives as its input the full swing timing signal at input node 208. The full swing timing signal is input into an optional pulse shaping stage 302, which may be employed if desired to modify the pulse width of the input full swing timing signal in order to, for example, produce a signal of a desired pulse width for timing purposes. Pulse shaping circuits are well known in the art and will not be belabored here for the sake of brevity.

The full swing timing signal (after pulse shaping if such is desired) is then input into a reduced voltage timing driver stage 304, which essentially shifts the voltage level of the timing signal from a full swing voltage level (e.g., $V_{DD}$) to a reduced voltage level (e.g., $V_{DD}/N$ where N is an integer) and outputs the reduced voltage timing signal on conductor 212 as shown.

Figure 4:
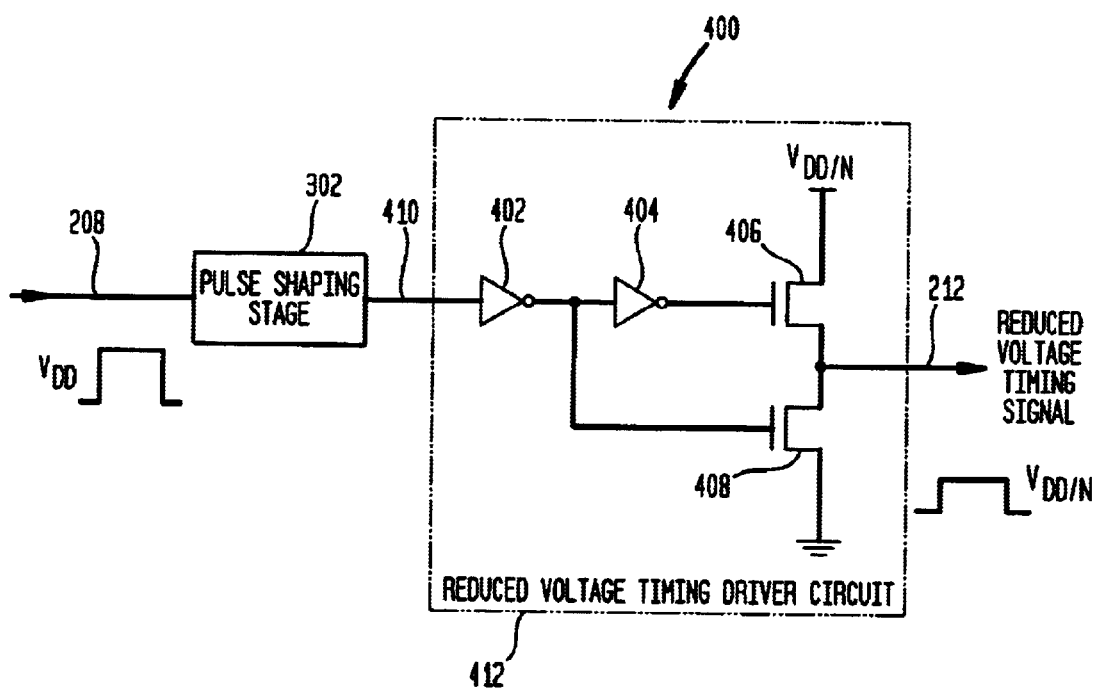
FIG. 4 illustrates, in accordance with one embodiment of the present invention, a detailed implementation of timing driver circuit of FIG. 3.

FIG. 4 illustrates, in accordance with one embodiment of the present invention, a timing driver circuit 400, representing a detailed implementation of timing driver circuit 202 of FIG. 3. Although the circuit of FIG. 4 is a preferred implementation, it is only exemplary and the invention is not so limiting. Again, input node 208 and pulse shaping stage 302, which is well known, are shown. A reduced voltage timing driver circuit 412, representing one implementation of reduced voltage timing driver stage 304 of FIG. 3, is implemented by two CMOS inverters 402 and 404 and two n-FETs (n-type field effect transistors) 406 and 408. As shown in FIG. 4, n-FET 406 is coupled in series with n-FET 408 between a reduced voltage source $V_{DD}/N$ and ground.

When an input node 410 of reduced voltage timing driver circuit 412 is high ($V_{DD}$), a low voltage level (ground) appears at the gate of n-FET 408 (due to the operation of inverter 402), turning off n-FET 408. The high voltage level ($V_{DD}$) at input node 410 causes a high voltage level ($V_{DD}$) to appear at the gate of n-FET 406 (due to the operation of inverters 402 and 404), turning it on. As such, output conductor 212 is decoupled from ground and is pulled up to the voltage level of the reduced power source, or $V_{DD}/N$.

When an input node 410 of reduced voltage timing driver circuit 412 is low (ground), a low voltage level (ground) to appear at the gate of n-FET 406 (due to the operation of inverters 402 and 404), turning it off. As such, output conductor 212 is decoupled from the reduced power source. The low voltage level (ground) at input node 410 causes a high voltage level ($V_{DD}$) appears at the gate of n-FET 408 (due to the operation of inverter 402), turning on n-FET 408 and pulling output conductor 212 to ground. Thus, reduced voltage timing driver circuit 412 functions as a level shifter circuit to shift the voltage level of the timing signal from a full swing voltage level to a reduced swing voltage level.

Figure 5:
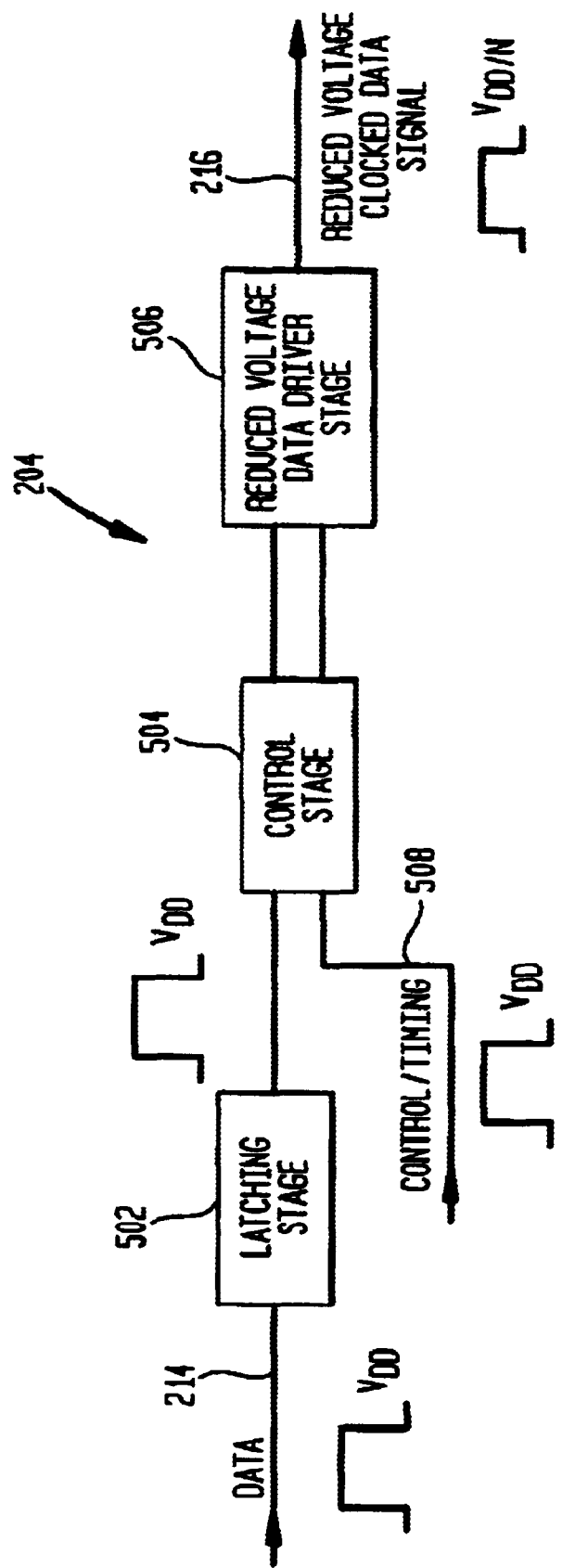
FIG. 5 illustrates, in accordance with one embodiment of the present invention, a high level block diagram implementation of data driver circuit of FIG. 2.

FIG. 5 illustrates, in accordance with one embodiment of the present invention, a high level block diagram implementation of data driver circuit 204 of FIG. 2. Data driver circuit 204, as mentioned, receives as its input the full swing data signal at input node 214. The full swing data signal is input into an optional latching stage 502, which may be employed to hold the data until required by a control stage 504.

Control stage 504 receives as its inputs latched data from latching stage 502 and the full swing timing/control signal at an input node 508 (derived from the full swing timing/control signal at input node 208 of FIG. 2). Although not explicitly shown in FIG. 5 to simplify the illustration, an optional conventional delay circuit may be implemented in front of input node 208 to furnish the desired delay to produce the full swing timing/control signal at an input node 508. Control stage 504 is employed to tri-state, responsive to a first state of the timing/control signal at input node 508, a reduced voltage data driver stage 506 from the input data lines. Control stage 504 is also employed to tri-state, responsive to the first state of the timing/control signal at input node 508, latching stage 502 and/or the input data lines from reduced voltage data driver stage 506.

Once the control/timing signal on input node 508 changes states (e.g., low to high or vice versa), the latched data signal and the control/timing signal are furnished to reduced voltage data driver stage 506, which outputs the reduced voltage clocked data signal on conductor 216 (to be received by data clocking circuit 206 of FIG. 2). In this manner, data driver circuit 204 receives the full swing data and control/timing signals and outputs a reduced voltage clocked data signal having a reduced voltage level.

Figure 6:
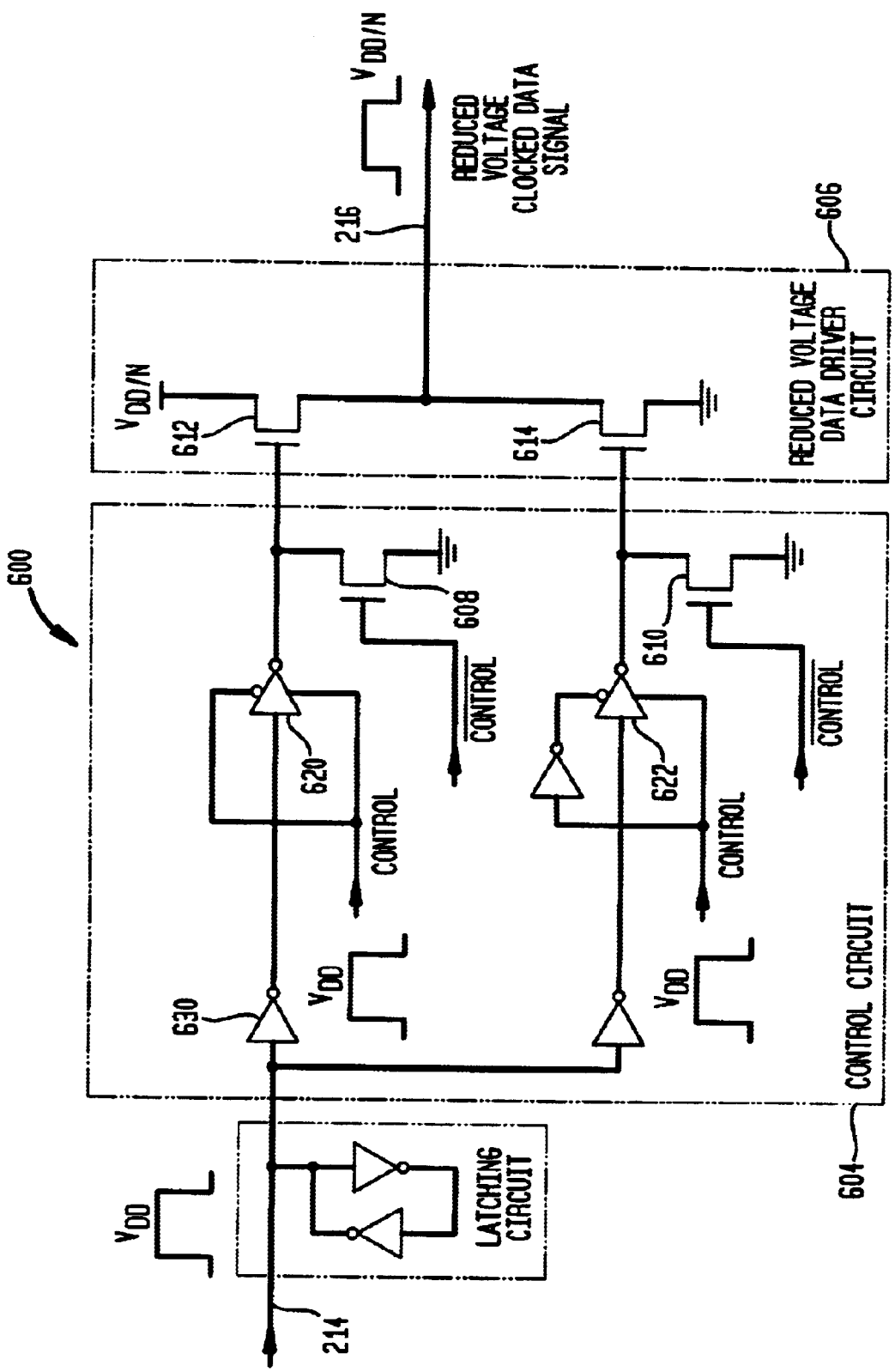
FIG. 6 illustrates, in accordance with one embodiment of the present invention, a detailed implementation of data driver circuit of FIG. 5.

FIG. 6 illustrates, in accordance with one embodiment of the present invention, data driver circuit 600, representing a detailed implementation of data driver circuit 204 of FIG. 5. Although the circuit of FIG. 6 is a preferred implementation, it is only exemplary and the invention is not so limiting. Again, input node 214 of FIGS. 2 and 5, which carries the full swing data signal is shown in FIG. 6. Latching circuit 602 is a commonly used implementation of latching stage 502 of FIG. 5 although any conventional latching technique may well be employed. Reduced voltage data driver circuit 606 is one implementation of reduced voltage data driver stage 506 of FIG. 5 and is employed to shift the voltage level of the clocked data signal from a full swing voltage level to a reduced voltage level.

Control circuit 604 is one implementation of control stage 504 of FIG. 5. In the example of FIG. 6, when the timing/control signal is low, control circuit 604 tri-states the input full swing data signal line (at input node 214) from reduced voltage data driver circuit 606 as well as tri-states the output reduced voltage clocked data signal line (at conductor 216) from the remainder of data driver circuit 600. By way of example, a low control signal disables inverting tri-state buffers 620 and 622, essentially decoupling the full swing data signal line (at input node 214) from reduced voltage data driver circuit 606. A low control signal also turns on n-FETs 608 and 610 to pull the gates of n-FETs 612 and 614 of reduced voltage data driver circuit 606 to ground. Accordingly, n-FETs 612 and 614 are both off, essentially tri-stating output conductor 216 from the remainder of data driver circuit 600.

When the control signal goes high, the gates of n-FETs 608 and 610 go low, which turn these n-FETs 608 and 610 off, thereby decoupling the gates of n-FETs 612 and 614 from ground. The high state of the control signal also enables inverting tri-state buffers 620 and 622. If the data latched by latching circuit 602 is high, the output of inverting tri-state buffer 622 will be low, thereby turning off n-FET 614, thus decoupling output conductor 216 from ground. On the other hand, inverter 630 will cause the data to appear low at the input of inverting tri-state buffer 620, causing inverting tri-state buffer 620 to pull the gate of n-FET 612 high, thus turning on n-FET 612 and coupling output conductor 216 to the reduced voltage source $V_{DD}/N$. In an analogous manner, if the control signal is high and the latched data is low, n-FET 612 will be off and n-FET 614 will be on, causing output conductor 216 to be pulled to ground. As can be seen, data driver circuit 600 of FIG. 6 clocks out a reduced voltage clocked data signal having a reduced voltage level from the input full swing data signal and responsive to the input full swing control signal.

Figure 7:
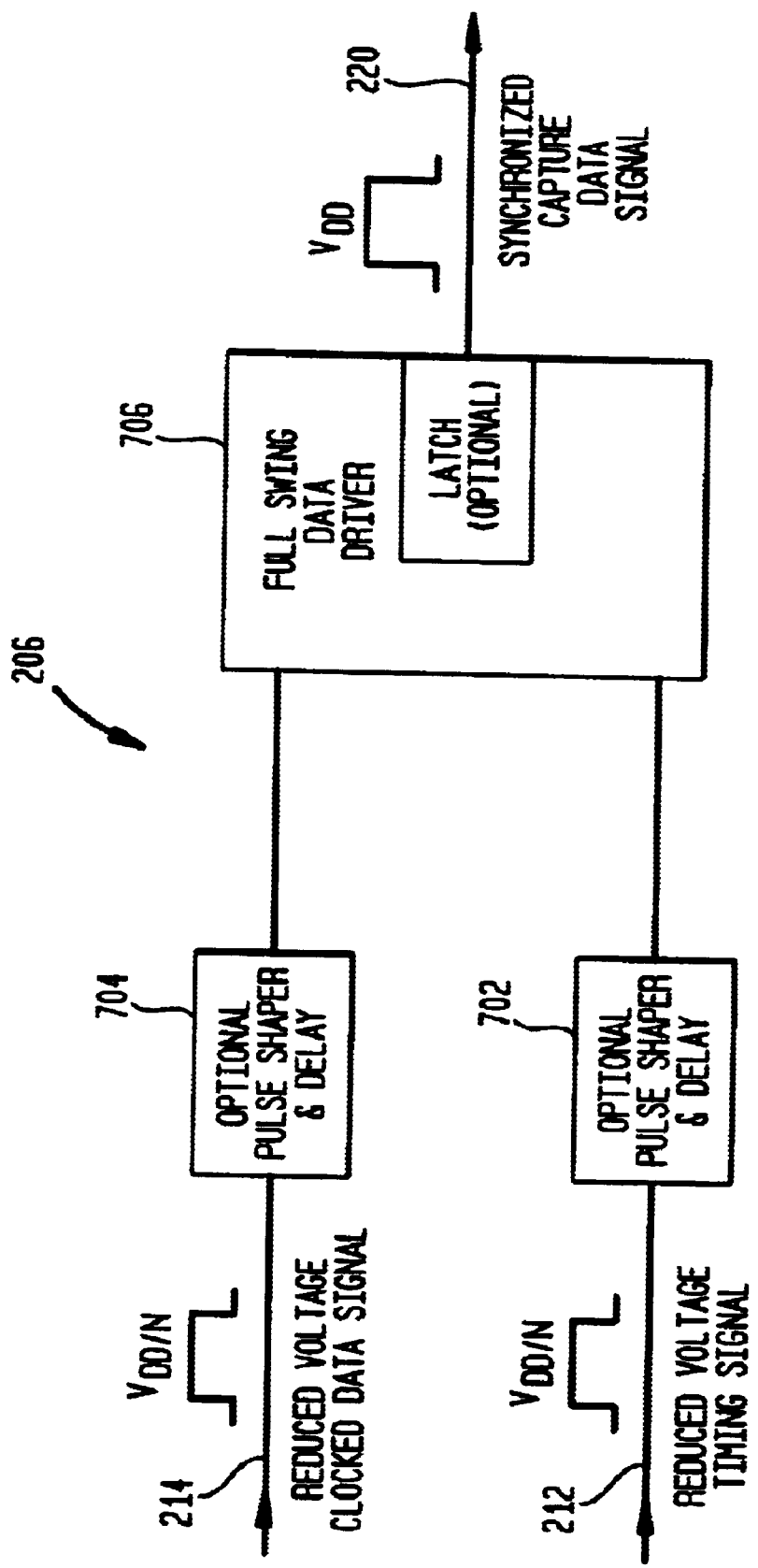
FIG. 7 illustrates, in accordance with one embodiment of the present invention, a high level block diagram implementation of data clocking circuit of FIG. 2.

FIG. 7 illustrates, in accordance with one embodiment of the present invention, a high level block diagram implementation of data clocking circuit 206 of FIG. 2. Data clocking circuit 206, as mentioned, receives as its inputs a reduced voltage timing signal (on conductor 212 from timing driver circuit 202) and a reduced voltage clocked data signal (on conductor 216 from data driver circuit 204) and outputs a synchronized capture data signal on output node 220. The synchronized capture data signal represents a signal synchronizing the data capture of data in the full swing data signal (input into data driver circuit 204) with the timing information provided in the full swing timing signal (input into timing driver circuit 202) after it has been transmitted to the receiving data clocking circuit 206 via reduced voltage levels.

As shown, both the reduced voltage timing signal on conductor 212 and the reduced voltage clocked data signal on conductor 214 may be delayed and/or have their pulses properly shaped via optional pulse shaper/delay circuits 702 and 704 respectively. Thereafter, these signals are furnished to a full swing data driver 706, which performs the data synchronization on these two reduced voltage level signals and produces a full swing synchronized capture data signal on output node 220.

In one embodiment, the output of data clocking circuit 206 of the synchronized data capture circuit is latched and tri-statable. As such, the outputs of individual synchronized data capture circuits (such as that shown in FIG. 2) may then be clocked out at the receiving end using an appropriate clocking signal. Such an implementation is advantageous in situations whereby data in multiple data signal lines need to be synchronized with their timing signals and captured in a specific sequence.

Figure 8:
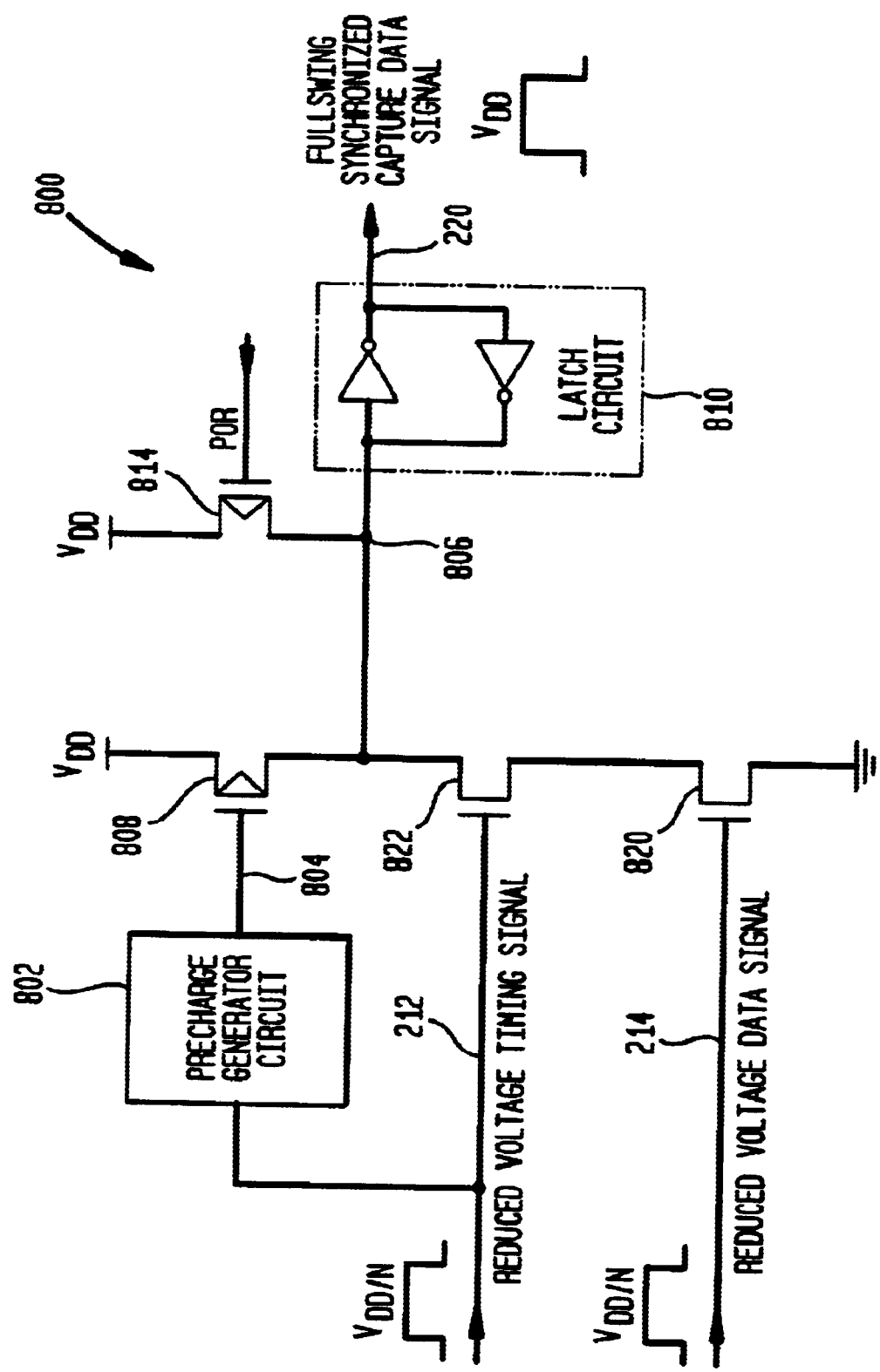

FIG. 8 illustrates, in accordance with one embodiment of the present invention, a data clocking circuit 800, representing a detailed implementation of data clocking circuit 206 of FIG. 7. The circuit of FIG. 8 is most easily understood with reference to the timing diagram of FIG. 9. Note that although the circuit of FIG. 8 is a preferred implementation, it is only exemplary and the invention is not so limiting. Furthermore, optional pulse shaping/delay circuits (discussed in connection with FIG. 7) have been omitted to simplify the discussion.

In FIG. 8, there is shown a precharge generator circuit 802, which is employed to generate a low precharge pulse on a node 804. The low precharge pulse is employed to place a node 806 in a known state prior to data synchronizing.

Preferably, the precharge pulse goes low prior to data capturing. As the precharge pulse goes low at node 804, a p-FET 808 conducts, thereby pulling node 806 to $V_{DD}$. Node 806 is latched high ($V_{DD}$) by a latching circuit 810, which is shown in FIG. 8. Note that node 806 is also pulled high by a p-FET 814 upon power up or a power reset, conditions which generate a low pulse on the POR signal. This is intended to place node 806 in a known state upon power up or a power reset.

Since the precharge pulse is arranged to go low prior to the arrival of the reduced voltage data and timing information, n-FET 822 stay off The low precharge pulse ends at time t0 as shown in FIG. 9, i.e., the precharge signal goes high at time t0 to turn off p-FET 808 after it has pulsed low, in preparation for synchronizing data and timing by the data clocking circuit 800. The operation of precharge generation circuit 802 is explored later with reference to a subsequent figure herein.

From time t1 to t3, the data contained in the reduced voltage clocked data a signal is valid and can be synchronized with the reduced voltage timing signal. If the piece of data to be captured has a high value $V_{DD}/N$, the high value of the reduced voltage clocked data signal turns on an n-FET 820. However, since the reduced voltage-timing signal has not arrived at time t1, an n-FET 822 remains off. At time t2 (see FIG. 9), the reduced voltage timing signal is asserted, causing n-FET 822 to also turn on. A current path is thus created between node 806 and ground between time t2 and t3, causing node 806 to be pulled to ground and the synchronized capture data signal on output node 220 to go high (by the operation of the inverter in latch circuit 810.

On the other hand, if the piece of data to be captured has a low value, n-FET 820 remains off even after the arrival of the reduced voltage timing pulse (staring at time t2). Node 806 thus remains high, causing output node 220 to stay low. Accordingly, a full swing synchronized capture data signal is created at output node 220, which synchronizes the data in the reduced voltage clocked data signal on conductor 214 with the timing information in the reduced voltage timing signal on conductor 212.

After data capture is performed, a low precharge pulse restores data clocking circuit 800 back to its ready state for the next data synchronization cycle. With reference to FIG. 9, the precharge signal goes low at time t4, pulling node 806 high and latching it at the high value (and output node 220 at the low value) to prepare for the arrival of the next data and timing cycle.

FIG. 10A illustrates, in accordance with one embodiment of the present invention, a detailed implementation of precharge generation circuit 802 of FIG. 8. The circuit of FIG. 10A is most easily understood with reference to the timing diagram of FIG. 10B. Note that although the circuit of FIG. 10A is a preferred implementation, it is only exemplary and the invention is not so limiting.

With reference to FIG. 10A, the reduced voltage timing signal on conductor 212 is input into a non-inverting level shifter 1002, which essentially shifts the voltage level of the timing signal from a reduced voltage level to a full swing voltage level. An implementation of level shifter 1002 is discussed later in connection with FIG. 11 herein. The full swing voltage level is then delayed through an inverting delay circuit 1004, which is implemented in the example of FIG. 10A by three CMOS inverters (the specific number of inverters in the delay chain is only exemplary and may vary as needed). The output of inverting delay circuit 1004 is OR'ed via an OR circuit 1006 with the full swing timing signal out of non-inverting level shifter 1002. In the example of FIG. 10A, the OR operation is performed by a NOR gate 1008 in series with an inverter gate 1010 although this is only exemplary. As will be apparent in the discussion that follows, the combination of inverting delay circuit 1004 and OR circuit 1006 creates a pulse shaper circuit, with the width of the precharge pulse determined by the delay time of delay circuit 1004.

In operation, when the reduced voltage timing signal on conductor 212 is low initially, node 1012, which is the full swing output of non-inverting level shifter 1002, also stays low. Node 1014, which is the inverted and delayed version of the full swing timing signal at node 1012, is high, causing node 1016 (i.e., the precharge signal) to stay high.

After some time, the reduced voltage timing signal pulse arrives on conductor 212. With reference to FIG. 10B, the low-to-high transition of the reduced voltage timing signal is marked by reference number 1050 at time t0. This low-to-high transition (1050) is reproduced by non-inverting level shifter 1002, albeit at the full swing voltage level (shown by reference number 1052 in FIG. 10B). After a predefined delay time (determined by the delay of inverting delay circuit 1004), node 1014 transitions from high to low (reference number 1054) at time t1. Node 1016 continues to stay high since node 1012 is high as node 1014 goes low.

At time t2, the reduced voltage timing signal goes away, i.e., transitions back from high to low. This is marked by reference number 1060 in FIG. 10B. This high-to-low transition of the reduced voltage timing signal is reproduced at the full swing voltage level by non-inverting level shifter 1002 (reference number 1062 of FIG. 10B). Thus node 1012 transitions from high to low shortly after time t2 (the short delay is due to the operation of the non-inverting level shifter circuit 1002). The high-to-low transition of node 1012 causes node 1016 (the precharge signal) to go low (reference number 1056) since node 1014 is already low when node 1012 goes from high to low.

After a predefined delay time (determined by the delay of inverting delay circuit 1004), node 1014 transitions from low to high (reference number 1064) at time t3 due to the high-to-low transition of node 1012. This low-to-high transition of node 1014 is marked by reference number 1064 in FIG. 10B and causes node 1016 to go back to high (reference number 1066). Thus, a low precharge pulse is created at node for use by the data clocking circuit (such as that shown in FIG. 8).

FIG. 11 illustrates, in accordance with one embodiment of the present invention a non-inverting level shifter 1100, representing a detailed implementation of non-inverting level shifter 1002 of FIG. 10. Note that although the circuit of FIG. 11 is a preferred implementation, it is only exemplary and the invention is not so limiting. As mentioned, non-inverting level shifter 1100 receives as its input a reduced voltage timing signal (conductor 212) and outputs a full swing voltage timing signal (node 1012). N-FET 1102 essentially passes the reduced voltage timing signal at conductor 212 to a node 1114 whenever a $V_{DD}$ voltage is supplied. When conductor 212 is low (e.g., ground), node 1114 is also low, which causes a p-FET 1116 to conduct, pulling a node 1118 to $V_{DD}$. The low node 1114 also turns off an n-FET 1120, decoupling node 1118 from ground. The high node 1118 causes a p-FET 1124 to remain off to decouple node 1114 from $V_{DD}$ and causes output node 1012 to go low by the inverting action of an inverter 1122. Thus, a low reduced voltage timing signal at conductor 212 causes the full swing timing signal at output node 1012 to be low.

When the reduced voltage timing signal on conductor 212 is high (e.g., $V_{DD}/N$), node 1114 is also at $V_{DD}/N$, which causes n-FET 1120 to turn on and pull node 1118 to ground. The low node 1118 turns on p-FET 1124 to pull node 1114 up close to $V_{DD}$, thus essentially turning off p-FET 1116 to decouple node 1118 from $V_{DD}$. Node 1118 is now at ground, which causes output node 1012 to go high ($V_{DD}$) by the inverting action of inverter 1122. Thus, a voltage level of $V_{DD}/N$ of the reduced voltage timing signal on conductor 212 causes the full swing timing signal at output node 1012 to be pulled to $V_{DD}$.

As can be appreciated from the foregoing, the inventive synchronized data capture circuit advantageously receives as its input full swing data and timing signals, converts them to reduced voltage level signals, performs synchronization of data and timing on the reduced voltage level signals, and outputs the synchronized data as a full swing signal at its output. Since reduced voltage signals are employed, the inventive synchronized data capture circuit advantageously reduces power consumption and increases performance while still rendering the circuit compatible with other circuits of the IC operating on full swing signals.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In an integrated circuit, a synchronized data capture circuit configured to synchronize capturing of data in a data signal with a timing signal, said synchronized data circuit employing voltage signals having a reduced voltage level, said data signal and said timing signal having a first voltage level higher than said reduced voltage level, comprising:

a timing driver circuit arranged to receive said timing signal, said timing driver circuit outputting a reduced voltage timing signal having said reduced voltage level;

a data driver circuit arranged to receive said data signal and said timing signal, said data driver outputting a reduced voltage clocked data signal having said reduced voltage level; and a data clocking circuit coupled to said timing driver circuit and said data driver circuit, said data clocking circuit being arranged to receive said reduced voltage timing signal and said reduced voltage clocked data signal, said data clocking circuit outputting a synchronized capture data signal having said first voltage level higher than said reduced voltage level.

2. The synchronized data capture circuit of claim 1 wherein said first voltage level represents the operating voltage level of circuits peripheral to said synchronized data capture circuit in said integrated circuit.

3. The synchronized data capture circuit of claim 1 wherein said timing driver circuit comprises a reduced voltage timing driver circuit, said reduced voltage timing driver circuit having a reduced voltage timing driver circuit input for receiving a first signal having said first voltage level and a reduced voltage timing driver circuit output for outputting a second signal having said reduced voltage level.

4. The synchronized data capture circuit of claim 3 wherein said timing driver circuit further comprises a pulse shaper circuit coupled to said reduced voltage timing driver circuit, said pulse shaper circuit being arranged to receive said timing signal and to output a pulse-modified timing signal to said reduced voltage timing driver circuit as said first signal, said pulse-modified timing signal having said first voltage level and a modified pulse width that is different from a pulse width of said timing signal.

5. The synchronized data capture circuit of claim 4 wherein said reduced voltage timing driver circuit includes a first inverter having a first inverter input and a first inverter output, said first inverter input representing said reduced voltage timing driver circuit input for receiving said first signal, a second inverter having a second inverter input and a second inverter output, said second inverter input being coupled to said first inverter output, a first n-FET having a first n-FET gate, a first n-FET drain, and a first n-FET source, said first n-FET gate being coupled to said second inverter output, one of said first n-FET drain and said first n-FET source being coupled to a reduced voltage source, a second n-FET having a second n-FET gate, a second n-FET drain, and a second n-FET source, said second n-FET gate being coupled to said first inverter output, one of said second n-PET drain and said second n-PET source being coupled to ground, another of said second n-FET drain and said second n-FET source being coupled to said reduced voltage timing driver circuit output, another of said first n-FET drain and said first n-FET source also being coupled to said reduced voltage timing driver circuit output.

6. The synchronized data capture circuit of claim 3 wherein said reduced voltage timing driver circuit includes a first inverter having a first inverter input and a first inverter output, said first inverter input representing said reduced voltage timing driver circuit input for receiving said first signal, a second inverter having a second inverter input and a second inverter output, said second inverter input being coupled to said first inverter output, a first n-FET having a first n-FET gate, a first n-FET drain, and a first n-FET source, said first n-FET gate being coupled to said second inverter output, one of said first n-FET drain and said first n-FET source being coupled to a reduced voltage source, a second n-FET having a second n-FET gate, a second n-FET drain, and a second n-FET source, said second n-FET gate being coupled to said first inverter output, one of said second n-FET drain and said second n-FET source being coupled to ground, another of said second n-FET drain and said second n-FET source being coupled to said reduced voltage timing driver circuit output, another of said first n-FET drain and said first n-FET source also being coupled to said reduced voltage timing driver circuit output.

7. The synchronized data capture circuit of claim 1 wherein said data driver circuit comprises a latching stage having a latching stage input and a latching stage output, said latching stage input being coupled to receive said data signal and configured to latch said data signal to provide a latched data signal at said latching stage output;

a control stage having a control stage data input coupled to said latching stage output, said control stage further includes a control stage control input arranged to receive said a control signal having said first voltage level, said control signal being one of a delayed version of said timing signal and said timing signal; and a reduced voltage data driver circuit coupled to said control stage, said reduced voltage data driver circuit having a reduced voltage clocked data signal output, said reduced voltage data driver circuit being configured to produce, at said reduced voltage clocked data signal output, said reduced voltage clocked data signal having said reduced voltage level from said data signal and responsive to said control signal when said control signal is in a first logic state of its two logic states, wherein said control stage is configured to decouple said latching stage output from said reduced voltage data driver circuit and to decouple said reduced voltage clocked data signal output from said latching stage output when said control signal is in a second logic state of its two logic states.

8. The synchronized data capture circuit of claim 7 wherein said control signal is a delayed version of said timing signal.

9. The synchronized data capture circuit of claim 7 wherein said reduced voltage data driver circuit further includes a first n-FET having a first n-FET gate, a first n-FET drain, and a first n-FET source, one of said first n-FET drain and said first n-FET source being coupled to a reduced voltage source, a second n-FET having a second n-FET gate, a second n-FET drain, and a second n-FET source, one of said second n-FET drain and said second n-FET source being coupled to ground, another of said second n-FET drain and said second n-FET source being coupled to said reduced voltage clocked data signal output, another of said first n-FET drain and said first n-FET source also being coupled to said reduced voltage clocked data signal output.

10. The synchronized data capture circuit of claim 9 wherein said control stage further includes a first inverter having a first inverter output and a first inverter input coupled to said control stage data input;

a first inverting tri-state buffer having a first inverting tri-state buffer input coupled to said first inverter output, said first inverting tri-state buffer includes first inverting tri-state buffer output coupled to said first n-FET gate, said first inverting tri-state buffer being enabled by said first logic state of said two logic states of said control signal, said first inverting tri-state buffer being disabled by said second logic state of said two logic states of said control signal;

a third n-FET having a third n-FET gate, a third n-FET drain, and a third n-FET source, one of said third n-FET drain and said third n-FET source being coupled to ground, another of said third n-FET drain and said third n-FET source being coupled to said first n-FET gate and said first inverting tri-state buffer output, said third n-FET gate being arranged to receive a complement one of said control signal;

a second inverting tri-state buffer having a second inverting tri-state buffer input coupled to said control stage data input, said second inverting tri-state buffer includes second inverting tri-state buffer output coupled to said second n-FET gate, said second inverting tri-state buffer being enabled by said first logic state of said two logic states of said control signal, said second inverting tri-state buffer being disabled by said second logic state of said two logic states of said control signal;

a fourth n-FET having a fourth n-FET gate, a fourth n-FET drain, and a fourth n-FET source, one of said fourth n-FET drain and said fourth n-FET source being coupled to ground, another of said fourth n-FET drain and said fourth n-FET source being coupled to said second n-FET gate and said second inverting tri-state buffer circuit, said fourth n-FET gate being arranged to receive said complement one of said control signal.

11. The synchronized data capture circuit of claim 1 wherein said data clocking circuit comprises a full swing data driver circuit having a first data driver input and a second data driver input, said first data driver input being configured to receive one of said reduced voltage clocked data signal having said reduced voltage level and a pulse-shaped version of said reduced voltage clocked data signal having said reduced voltage level from said data driver circuit, said second data driver input being configured to receive one of said reduced voltage timing signal having said reduced voltage level and a pulse-shaped version of said reduced voltage timing signal having said reduced voltage level from said timing driver circuit, said full swing data driver further includes a full swing data driver output for outputting said synchronized capture data signal having said first voltage level higher than said reduced voltage level.

12. The synchronized data capture circuit of claim 11 wherein said first data driver circuit input is configured to received said pulse-shaped version of said reduced voltage clocked data signal, said data clocking circuit further includes a pulse shaper circuit coupled to said first data driver circuit input.

13. The synchronized data capture circuit of claim 11 wherein said second data driver circuit input is configured to received said pulse-shaped version of said reduced voltage timing signal, said data clocking circuit further includes a pulse shaper circuit coupled to said second data driver circuit input.

14. The synchronized data capture circuit of claim 11 wherein said full swing data driver circuit includes:

a precharge node;

a precharge generation circuit having a precharge input and a precharge output, said precharge generation circuit being configured to place said precharge node in a known state prior to data synchronizing, said precharge input being coupled to receive said one of said reduced voltage timing signal having said reduced voltage level and said pulse-shaped version of said reduced voltage timing signal having said reduced voltage level;

a first p-FET having a first p-FET gate, a first p-FET drain, and a first p-FET source, said first p-FET gate being coupled to said pre-charge output, one of said first p-FET drain and said first p-FET source being coupled to a voltage source having said first voltage level, another of said first p-FET drain and said first p-FET source being coupled to said precharge node;

a first n-FET having a first n-FET gate, a first n-FET drain, and a first n-FET source, said first n-FET gate being coupled to receive said one of said reduced voltage timing signal having said reduced voltage level and said pulse-shaped version of said reduced voltage timing signal having said reduced voltage level, one of said first n-FET drain and said first n-FET source being coupled to said precharge node;

a second n-FET having a second n-FET gate, a second n-FET drain, and a second n-FET source, said second n-FET gate being coupled to receive said one of said reduced voltage clocked data signal having said reduced voltage level and said pulse-shaped version of said reduced voltage clocked data signal having said reduced voltage level, one of said second n-FET drain and said second n-FET source being coupled to another of said first n-FET drain and said first n-FET source, another of said second n-FET drain and said second n-FET source being coupled to ground;

a third n-FET having a third n-FET gate, a third n-FET drain, and a third n-FET source, said third n-FET gate being coupled to receive a power-on-reset signal, one of said third n-FET drain and said third n-FET source being coupled to said precharge node, another of said third n-FET drain and said third n-FET source being coupled to said voltage source having said first voltage level, wherein said precharge node is configured to output said synchronized capture data signal having said first voltage level.

15. The synchronized data capture circuit of claim 14 wherein said full swing data driver circuit further includes a latch circuit coupled to said precharge node.

16. The synchronized data capture circuit of claim 14 wherein said precharge generation circuit further includes:

a noninvertering level shifter having a noninverting level shifter input and a noninverting level shifter output for shifting a voltage level of a signal at said noninverting level shifter input from said reduced voltage level to said first voltage level, said noninverting level shifter input being configured to receive said reduced voltage timing signal, said noninverting level shifter output being configured to output a level-shifted version of said reduced voltage timing signal, said level-shifted version of said reduced voltage timing signal having said first voltage level;

an inverting delay circuit having an inverting delay circuit input and an inverting delay circuit output, said inverting delay circuit input being coupled to said noninverting level shifter output;

an OR circuit having a first OR input and a second OR input, said first OR input being coupled to said inverting delay circuit output, said second OR input being coupled to said noninverting level shifter output.

17. In an integrated circuit, a method for synchronizing capturing of data in a data signal with a timing signal, said method employs voltage signals having a reduced voltage level to accomplish said synchronized data capturing, said data signal and said timing signal having a first voltage level higher than said reduced voltage level, comprising:

receiving said timing signal using a timing driver circuit and outputting, responsive to said timing signal, a reduced voltage timing signal having said reduced voltage level from said timing driver circuit;

receiving said data signal and said timing signal using a data driver circuit and outputting, responsive to said data signal and said timing signal, a reduced voltage clocked data signal having said reduced voltage level from said data driver circuit;

performing said synchronizing data capturing using information contained in reduced voltage timing signal and said reduced voltage clocked data signal; and outputting a synchronized capture data signal having said first voltage level higher than said reduced voltage level responsive to said performing said synchronizing data capturing.

18. The method of claim 17 further comprising
performing pulse shaping on said timing signal prior to said outputting said reduced voltage timing signal.

19. The method of claim 17 wherein receiving said data signal and said timing signal using a data driver circuit and outputting, responsive to said data signal and said timing signal, said reduced voltage clocked data signal having said reduced voltage level from said data driver circuit comprises:

latching said data signal at a latching stage of said data driver circuit;

receiving said data signal from an output of said latching stage and said timing signal at a control stage of said data driver circuit; and employing control signals from said control stage to control an output signal of a reduced voltage data driver circuit of said data driver circuit, said control signals having said first voltage level, said output signals having said reduced voltage level and representing said reduced voltage clocked data signal.

20. The method of claim 17 further comprising performing pulse shaping on said reduced voltage timing signal prior to said performing said synchronizing data capturing.

21. The method of claim 17 further comprising performing pulse shaping on said reduced voltage clocked data signal prior to said performing said synchronizing data capturing.

22. A memory integrated circuit having a synchronized data capture circuit configured to synchronize capturing of data in a data signal with a timing signal, said synchronized data circuit employing voltage signals having a reduced voltage level, said data signal and said timing signal having a first voltage level higher than said reduced voltage level, comprising:

a timing driver circuit arranged to receive said timing signal, said timing driver circuit outputting a reduced voltage timing signal having said reduced voltage level;

a data driver circuit arranged to receive said data signal and said timing signal, said data driver outputting a reduced voltage clocked data signal having said reduced voltage level; and a data clocking circuit coupled to said timing driver circuit and said data driver circuit, said data clocking circuit being arranged to receive said reduced voltage timing signal and said reduced voltage clocked data signal, said data clocking circuit outputting a synchronized capture data signal having said first voltage level higher than said reduced voltage level.

23. The memory integrated circuit of claim 22 wherein said first voltage level represents the operating voltage level of circuits peripheral to said synchronized data capture circuit in said memory integrated circuit.

24. The memory integrated circuit of claim 22 wherein said timing driver circuit comprises a reduced voltage timing driver circuit, said reduced voltage timing driver circuit having a reduced voltage timing driver circuit input for receiving a first signal having said first voltage level and a reduced voltage timing driver circuit output for outputting a second signal having said reduced voltage level.

25. The memory integrated circuit of claim 24 wherein said timing driver circuit further comprises a pulse shaper circuit coupled to said reduced voltage timing driver circuit, said pulse shaper circuit being arranged to receive said timing signal and to output a pulse-modified timing signal to said reduced voltage timing driver circuit as said first signal, said pulse-modified timing signal having said first voltage level and a modified pulse width that is different from a pulse width of said timing signal.

26. The memory integrated circuit of claim 22 wherein said data driver circuit comprises a latching stage having a latching stage input and a latching stage output, said latching stage input being coupled to receive said data signal and configured to latch said data signal to provide a latched data signal at said latching stage output;

a control stage having a control stage data input coupled to said latching stage output, said control stage further includes a control stage control input arranged to receive said a control signal having said first voltage level, said control signal being one of a delayed version of said timing signal and said timing signal; and a reduced voltage data driver circuit coupled to said control stage, said reduced voltage data driver circuit having a reduced voltage clocked data signal output, said reduced voltage data driver circuit being configured to produce, at said reduced voltage clocked data signal output, said reduced voltage clocked data signal having said reduced voltage level from said data signal and responsive to said control signal when said control signal is in a first logic state of its two logic states, wherein said control stage is configured to decouple said latching stage output from said reduced voltage data driver circuit and to decouple said reduced voltage clocked data signal output from said latching stage output when said control signal is in a second logic state of its two logic states.

27. The memory integrated circuit of claim 26 wherein said control signal is a delayed version of said timing signal.

28. The memory integrated circuit of claim 22 wherein said data clocking circuit comprises a full swing data driver circuit having a first data driver input and a second data driver input, said first data driver input being configured to receive one of said reduced voltage clocked data signal having said reduced voltage level and a pulse-shaped version of said reduced voltage clocked data signal having said reduced voltage level from said data driver circuit, said second data driver input being configured to receive one of said reduced voltage timing signal having said reduced voltage level and a pulse-shaped version of said reduced voltage timing signal having said reduced voltage level from said timing driver circuit, said full swing data driver further includes a full swing data driver output for outputting said synchronized capture data signal having said first voltage level higher than said reduced voltage level.

29. The memory integrated circuit of claim 28 wherein said first data driver circuit input is configured to received said pulse-shaped version of said reduced voltage clocked data signal, said data clocking circuit further includes a pulse shaper circuit coupled to said first data driver circuit input.

30. The memory integrated circuit of claim 28 wherein said second data driver circuit input is configured to received said pulse-shaped version of said reduced voltage timing signal, said data clocking circuit further includes a pulse shaper circuit coupled to said second data driver circuit input.

* * * * *

UNITED STATES PATENT AND TRADEMARK OFFICE
CERTIFICATE OF CORRECTION

PATENT NO. : 6,668,031 B1
DATED : December 23, 2003
INVENTOR(S) : David Russell Hanson and Gerhard Mueller It is certified that error appears in the above-identified patent and that said Letters Patent is hereby corrected as shown below:

Column 2,
Line 5, "maybe" should read -- may be --.

Column 3,
Line 35, "scription" should read -- description --.

Column 8,
Line 41, insert "." after -- off --.

Column 10,
Line 14, delete "-" after -- outputs --.

Column 11,
Line 50, "n-PET" should read -- n-FET --.

Column 18,
Line 5, "received" should read -- receive --.

Signed and Sealed this

Eighth Day of June, 2004

JON W. DUDAS
*Acting Director of the United States Patent and Trademark Office*